(12) United States Patent
Liu et al.

(10) Patent No.: US 10,529,795 B2
(45) Date of Patent: Jan. 7, 2020

(54) ENHANCED INDUCTORS SUITABLE FOR INTEGRATED MULTI-CHANNEL RECEIVERS

(71) Applicant: Credo Technology Group Ltd., Grand Cayman (KY)

(72) Inventors: Xike Liu, Shanghai (CN); Kuan Peng, Shanghai (CN); Chan Ho Yeung, Hong Kong (CN); Yifei Dai, Shanghai (CN); Lawrence Chi Fung Cheng, San Jose, CA (US); Runsheng He, Sunnyvale, CA (US)

(73) Assignee: Credo Technology Group Ltd. (KY)

( * ) Notice: Subject to any disclaimer, the term of this patent is extended or adjusted under 35 U.S.C. 154(b) by 0 days.

(21) Appl. No.: 16/099,401

(22) PCT Filed: Jul. 27, 2016

(86) PCT No.: PCT/CN2016/091836
§ 371 (c)(1),
(2) Date: Nov. 6, 2018

(87) PCT Pub. No.: WO2018/018441
PCT Pub. Date: Feb. 1, 2018

(65) Prior Publication Data
US 2019/0198602 A1 Jun. 27, 2019

(51) Int. Cl.
*H01L 49/02* (2006.01)
*H01F 17/00* (2006.01)
(Continued)

(52) U.S. Cl.
CPC ......... *H01L 28/10* (2013.01); *H01F 17/0006* (2013.01); *H01F 41/041* (2013.01); *H03B 5/1212* (2013.01); *H01F 2017/0073* (2013.01)

(58) Field of Classification Search
CPC . H03B 5/08; H03B 5/12; H03B 12/06; H03B 12/1212; H03B 5/1215;
(Continued)

(56) References Cited

U.S. PATENT DOCUMENTS 4,686,488 A 8/1987 Attenborough
5,768,268 A 6/1998 Kline et al.
(Continued)

FOREIGN PATENT DOCUMENTS

CN 101990690 A 3/2011
CN 102132362 A 7/2011
(Continued)

OTHER PUBLICATIONS

International Search Report and Written Opinion dated May 9, 2017 of related International Application No. PCT/CN2016/091836.
(Continued)

*Primary Examiner* — Ryan Johnson
(74) *Attorney, Agent, or Firm* — Ramey and Schwaller, LLP; Daniel J. Krueger

(57) ABSTRACT

Integrated circuits such as multi-channel receivers may require loop inductors resistant to electromagnetic field interference. Such loop inductors may include multiple non-overlapping loops each defining a corresponding dipole, the multiple dipoles summing to zero, with at least one of said loops having unequal areas. The multiple non-overlapping loops may include: a center loop defining a central magnetic dipole; and a plurality of peripheral loops equally spaced around a perimeter of the center loop, each peripheral loop defining a peripheral magnetic dipole oriented opposite the central magnetic dipole, the plurality of peripheral loops substantially canceling a field from the central magnetic dipole. The total number of loops may be odd, with particu-
(Continued)

lar embodiments of three, five, and seven loop designs disclosed. Single and multi-turn embodiments are provided.

17 Claims, 5 Drawing Sheets

(51) Int. Cl.
    *H01F 41/04*         (2006.01)
    *H03B 5/12*          (2006.01)

(58) Field of Classification Search
    CPC . H03B 5/1231; H01F 5/003; H01F 2005/043; H01F 5/04; H01F 17/0006; H01F 27/2804; H01F 27/2809; H01F 27/29
    See application file for complete search history.

(56) References Cited

U.S. PATENT DOCUMENTS

| | | | |
|---|---|---|---|
| 6,678,842 B1 | 1/2004 | Shaffer et al. | |
| 7,058,150 B2 | 6/2006 | Buchwald et al. | |
| 7,151,430 B2 | 12/2006 | Mattsson | |
| 7,629,859 B2 | 12/2009 | El Rai | |
| 8,018,312 B2 | 9/2011 | Kossel et al. | |
| 8,183,971 B2 | 5/2012 | Le Guillou et al. | |
| 8,841,983 B2 | 9/2014 | Newton et al. | |
| 9,019,065 B2 * | 4/2015 | Gianesello | H01F 17/0006 336/200 |
| 9,177,709 B2 | 11/2015 | Parthasarathy et al. | |
| 9,196,409 B2 * | 11/2015 | Nazarian | H01F 5/003 |
| 9,299,764 B2 | 3/2016 | Mattsson et al. | |
| 9,385,859 B2 | 7/2016 | Kuan et al. | |
| 2007/0182502 A1 | 8/2007 | Shin | |
| 2007/0246805 A1 | 10/2007 | Ligang et al. | |
| 2008/0278250 A1 | 11/2008 | Hung | |
| 2012/0044034 A1 | 2/2012 | Nazarian et al. | |
| 2013/0149995 A1 | 6/2013 | Guionnet | |
| 2013/0322029 A1 | 12/2013 | Dror | |
| 2014/0225706 A1 | 8/2014 | Doyle et al. | |
| 2015/0003505 A1 | 1/2015 | Lusted et al. | |
| 2016/0337114 A1 | 11/2016 | Baden et al. | |

FOREIGN PATENT DOCUMENTS

| | | |
|---|---|---|
| CN | 102376415 A | 3/2012 |
| CN | 103179784 | 6/2013 |
| CN | 104584152 A | 4/2015 |
| EP | 1352258 B1 | 11/2009 |
| EP | 2648193 B1 | 7/2015 |

OTHER PUBLICATIONS

Notice of Allowance dated Mar. 8, 2019 of U.S. Appl. No. 15/702,715.
Office Action dated Apr. 19, 2019 of U.S. Appl. No. 15/423,398.
Ohliger, Michael A., et al. An Introduction to Coil Array Design for Parallel MRI, Wiley InterScience, 2006, 300-315, 19, John Wiley & Sons, Ltd.
International Search Report and Written Opinion dated Jan. 11, 2018 in PCT/CN2017/79860.
Non-Final Office Action dated Jan. 24, 2018 in U.S. Appl. No. 15/437,045.
Yang, Ching-Yuan "A high-frequency CMOS multi-modulus divider for PLL frequency synthesizers" pp. 150-162, published 2008.

* cited by examiner

ENHANCED INDUCTORS SUITABLE FOR INTEGRATED MULTI-CHANNEL RECEIVERS

RELATED APPLICATION

This application claims priority to PCT Patent Application No. PCT/CN2016/091836, filed on Jul. 27, 2016, which is incorporated in its entirety for all purposes by this reference.

BACKGROUND

Digital communications occur between sending and receiving devices over an intermediate communications medium, e.g., a fiberoptic cable or insulated copper wire, having one or more designated communications channels, e.g., carrier wavelengths or frequency bands. Each sending device typically transmits symbols at a fixed symbol rate, while each receiving device detects a (potentially corrupted) sequence of symbols and attempts to reconstruct the transmitted data.

A "symbol" is a state or significant condition of the channel that persists for a fixed period of time, called a "symbol interval." A symbol may be, for example, an electrical voltage or current level, an optical power level, a phase value, or a particular frequency or wavelength. A change from one channel state to another is called a symbol transition. Each symbol may represent (i.e., encode) one or more binary bits of the data. Alternatively, the data may be represented by symbol transitions, or by a sequence of two or more symbols. The simplest digital communication links use only one bit per symbol; a binary '0' is represented by one symbol (e.g., an electrical voltage or current signal within a first range), and binary '1' by another symbol (e.g., an electrical voltage or current signal within a second range) Channel non-idealities produce dispersion which may cause each symbol to perturb its neighboring symbols, causing intersymbol interference (ISI). As the symbol rate increases, ISI can make it difficult for the receiving device to determine which symbols were sent in each interval, particularly when such ISI is combined with additive noise.

As part of the process for recovering digital data from the degraded analog signal, receivers obtain discrete samples of the signal. The sample timing is often a critical part of the process, as it directly affects the signal to noise ratio possessed by the discrete samples. Strategies for detecting and tracking optimal sample times exist with varying degrees of tradeoff between simplicity and performance. In multi-channel environments, additional performance considerations must be taken into account when determining the optimal balance between simplicity and performance. Such performance considerations include timing jitter attributable to electromagnetic field interference with inductors in clock recovery modules.

SUMMARY

Accordingly, there are disclosed herein integrated circuits having one or more loop inductors configured to be resistant to electromagnetic field interference. Illustrative embodiments of such integrated circuits include multi-channel receivers employing independent clock recovery modules integrated on a monolithic semiconductor substrate. In at least some embodiments, the loop inductor includes multiple non-overlapping loops each defining a corresponding dipole, the multiple dipoles summing to zero, with at least one of said loops having an area unequal to that of at least one other of said loops. In at least some embodiments, the integrated circuit includes a plurality of inductors, each inductor comprising multiple non-overlapping loops with: a center loop defining a central magnetic dipole; and a plurality of peripheral loops equally spaced around a perimeter of the center loop, each peripheral loop defining a peripheral magnetic dipole oriented opposite the central magnetic dipole, the plurality of peripheral loops substantially canceling a field from the central magnetic dipole.

An illustrative embodiment of a method for manufacturing an integrated circuit with multiple low-field inductors on a substrate, the method includes: (i) providing a center loop that defines a central magnetic dipole; and (ii) providing a plurality of equally-sized peripheral loops equally spaced around a perimeter of the center loop, each peripheral loop defining a peripheral magnetic dipole oriented opposite the central magnetic dipole, the plurality of peripheral loops substantially canceling a field from the central magnetic dipole.

Each of the foregoing embodiments may be employed alone or in combination, together with any one or more of the following features: 1. Each inductor has a total number of loops, the total number being an odd integer. 2. The total number of loops is three, five, or seven. 3. Each loop has multiple turns. 4. Each inductor has at least one axis of symmetry. 5. Discounting the terminals, each inductor has two axes of symmetry. 6. Each inductor has a center tap, and each electrical path from the center tap to one of the terminals has a number of cross-overs and the same number of cross-unders. 7. The peripheral loops are equally-sized. 8. The circuit includes a plurality of independent oscillators, each oscillator including one of said plurality of inductors.

Figure 1:
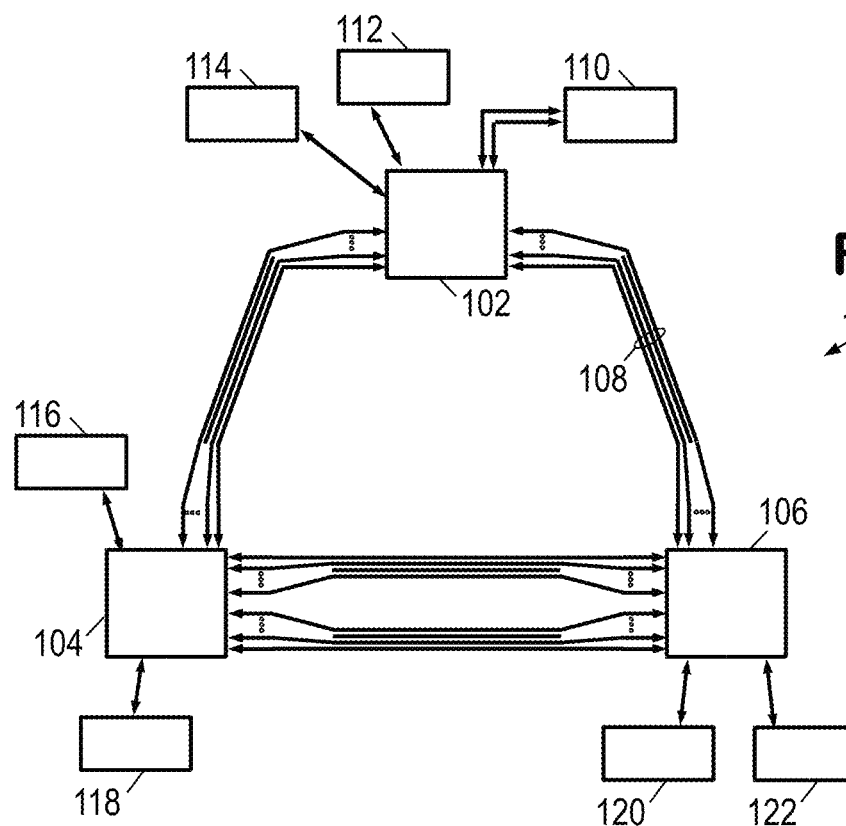
FIG. 1 shows an illustrative computer network.

It should be understood, however, that the specific embodiments given in the drawings and detailed description do not limit the disclosure. On the contrary, they provide the foundation for one of ordinary skill to discern the alternative forms, equivalents, and modifications that are encompassed in the scope of the appended claims.

DETAILED DESCRIPTION

The disclosed apparatus and methods are best understood in the context of the larger environments in which they operate. Accordingly, FIG. 1 shows an illustrative communications network 100 having communications links 108 interconnecting nodes 102, 104, 106 (representing switches, routers, base stations, gateways, and other forms of communications equipment) that direct and relay communications signals between terminal nodes 110-122 (which may represent mobile devices, portable computers, workstations, servers, network-attached storage systems, and other such communications sources and destinations). The communications network 100 may be or include, for example, the Internet, a wide area network, or a local area network.

Communication links 108 may be fiberoptic cables having bundles of optical fibers each carrying multiple modulated light signals on corresponding channels. Many fiberoptic cables have multiple bundles of optical fibers, with each fiber carrying multiple channels. With such dense packing of information signals, highly integrated communications transceivers are advantageous for efficient interfacing with communications equipment. It is desirable to combine the integrated circuits for multiple transmitter modules and multiple receiver modules on a shared monolithic semiconductor substrate, such as a segmented die of a silicon wafer. Such an environment presents potential issues of interference between the various transmitter or receiver modules.

Figure 2:
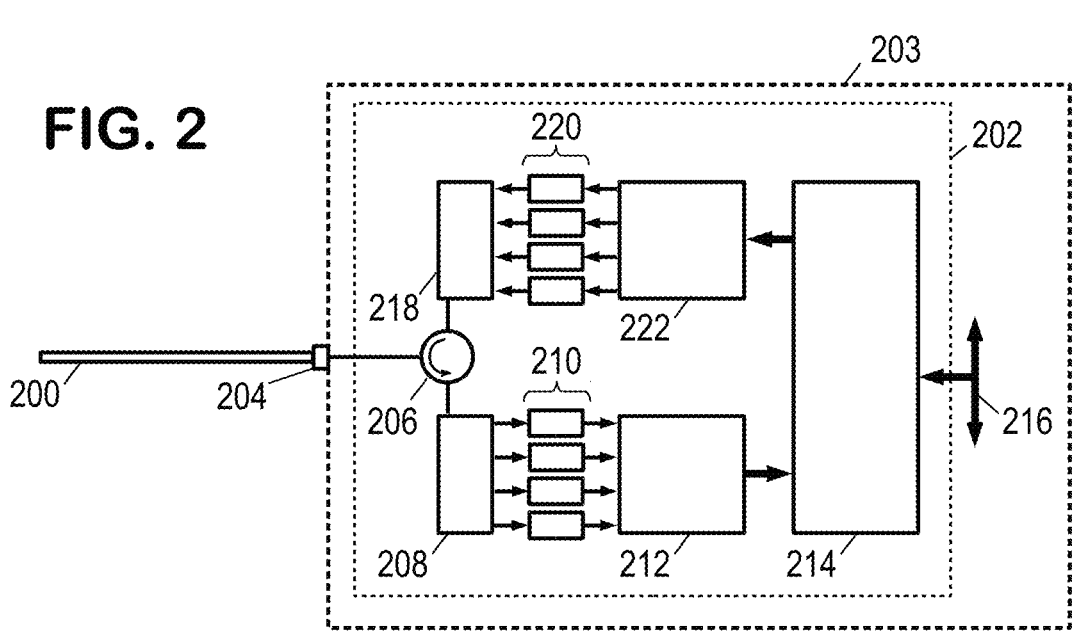
FIG. 2 is a function-block diagram of an illustrative transceiver.

FIG. 2 shows one such optical fiber 200 coupled to an illustrative transceiver 202 in a terminal node 203. (Each optical fiber in a bundle may be coupled to a different transceiver in the terminal node.) An optical connector 204 couples the fiber 200 to an optical circulator 206. The circulator 206 forwards incoming light signals to a channel splitter 208, which separates the various channels and provides one to each detector 210. The multiple detectors 210 each convert one of the light signals into an electrical receive signal. An integrated multi-channel receiver 212 operates on the electrical receive signals to extract the corresponding streams of digital data. An interface module 214 buffers the streams of digital data and converts them to a suitable format for communications of the terminal node's internal bus 216, in accordance with a standard I/O bus protocol. In some embodiments, the conversion performed by the interface module includes error correction and payload extraction.

From the internal bus 216, the interface module 214 also accepts digital data for transmission. In at least some embodiments, the interface module 214 packetizes the data with appropriate headers and end-of-frame markers, optionally adding a layer of error correction coding and/or a checksum. A multichannel transmitter 222 accepts the transmit data streams from interface module 214 and converts the digital signals into analog electrical drive signals for emitters 220, causing the emitters to generate optical signals that are coupled to a channel coupler 218. The channel coupler 218 provides them as a combined optical signal to the circulator 206, which forwards it as an outgoing signal to optical fiber 200.

Figure 3:
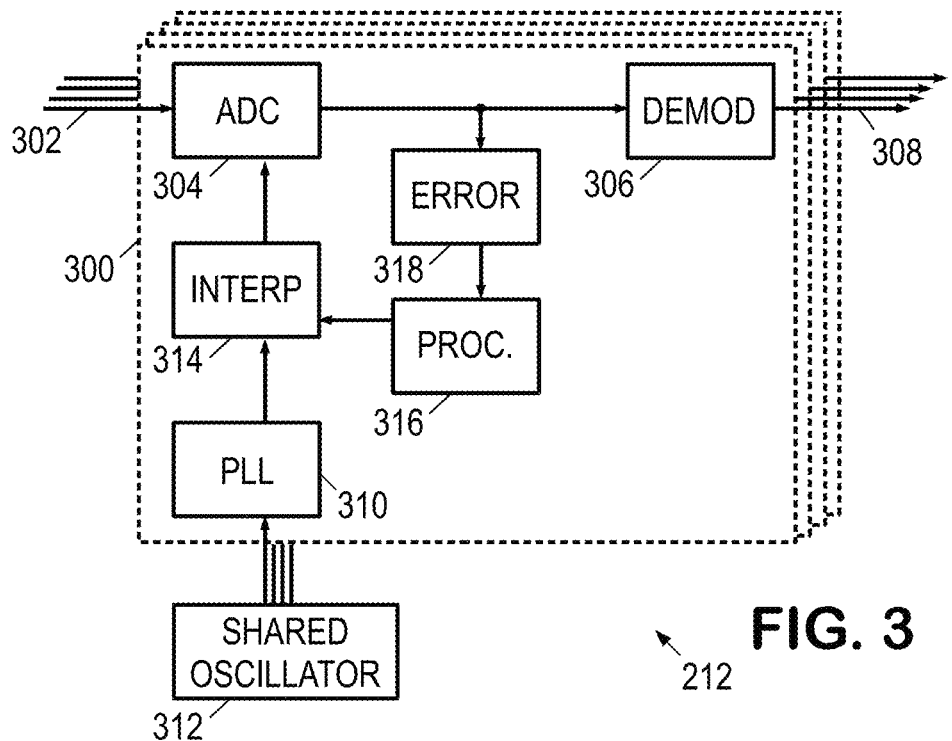
FIG. 3 is a function-block diagram of an illustrative multi-channel receiver.

Light signal modulation can be performed at extremely high symbol rates, necessitating that the receiver digitize the electrical receive signals at correspondingly high sampling rates, without sacrificing the precision required for maintaining an adequate signal-to-noise ratio. FIG. 3 shows one "clock and data recovery" technique implemented by an illustrative integrated multichannel receiver 212. The receiver 212 includes an individual receive module 300 for each of the electrical receive signals 302. Within each receive module 300, an analog-to-digital converter 304 samples the analog receive signal 302 at sample times corresponding to transitions in a clock signal, thereby providing a digital receive signal to a demodulator 306. The demodulator 306 applies equalization and symbol detection using, e.g., a matched filter, a decision feedback equalizer, a maximum likelihood sequence estimator, or any other suitable demodulation technique. The resulting stream of demodulated symbols 308 may be supplied to the interface module 214.

To derive a suitable clock signal for sampling, the receive module 300 employs a clock recovery module which includes a phase lock loop 310, a shared precision oscillator 312, a phase interpolator 314, a processor 316, and a timing error estimator 318. The phase lock loop 310 accepts an oscillator signal from a shared oscillator 312 and derives phase-locked clock signal having a frequency matched to the nominal symbol frequency for that channel. With multiple phase lock loops 310 operating from a shared oscillator 312, the multi-channel receiver 212 obtains multiple high-precision clock signals while restricting to the shared oscillator the hardware complexity normally required for such high precision. Stated in another way, the design requirements for oscillators internal to the phase lock loops 310 may be relaxed.

However, even if the remote transmitter employs a high-precision oscillator, its clock signal is likely to exhibit frequency and phase drift relative to shared oscillator 312, requiring each receive module 300 to modify the clock signal accordingly. A phase interpolator 314 converts the clock signal to a suitable sampling signal for analog-to-digital converter 304, correcting for phase and frequency offsets. A processor 316 provides the appropriate phase correction signal to the interpolator 314. To determine the appropriate phase correction, the processor 316 operates on a sequence of timing error estimates received from timing error estimator 318.

Timing error estimator 318 may operate using any of the suitable timing error estimation techniques disclosed in the open literature. Such techniques may first determine an amplitude error for each sample, e.g., by comparing the sample to an ideal amplitude (perhaps the amplitude of an uncorrupted symbol), or by determining a difference between the sample and the nearest decision threshold and subtracting that difference from the symbol margin. In some embodiments, the amplitude error is then correlated with the signal slope to obtain the timing error. In other embodiments, the amplitude error is correlated with the preceding symbol value or polarity to estimate the timing error. Still other embodiments employ oversampling and correlate the amplitude error with neighboring samples or differences between such neighboring samples to estimate the timing error.

Regardless of how it is obtained, the error estimate is preferably an unbiased estimate of timing error, but may alternatively be a binary sequence indicating whether the sample was acquired early (before the ideal sampling time) or late (after the ideal sampling time). From the timing error signal, the processor 316 estimates the clock signal's phase error and frequency offset, and combines the two to determine at any given instant the phase adjustment that the phase interpolator 314 should apply to compensate for both errors.

Figure 4:
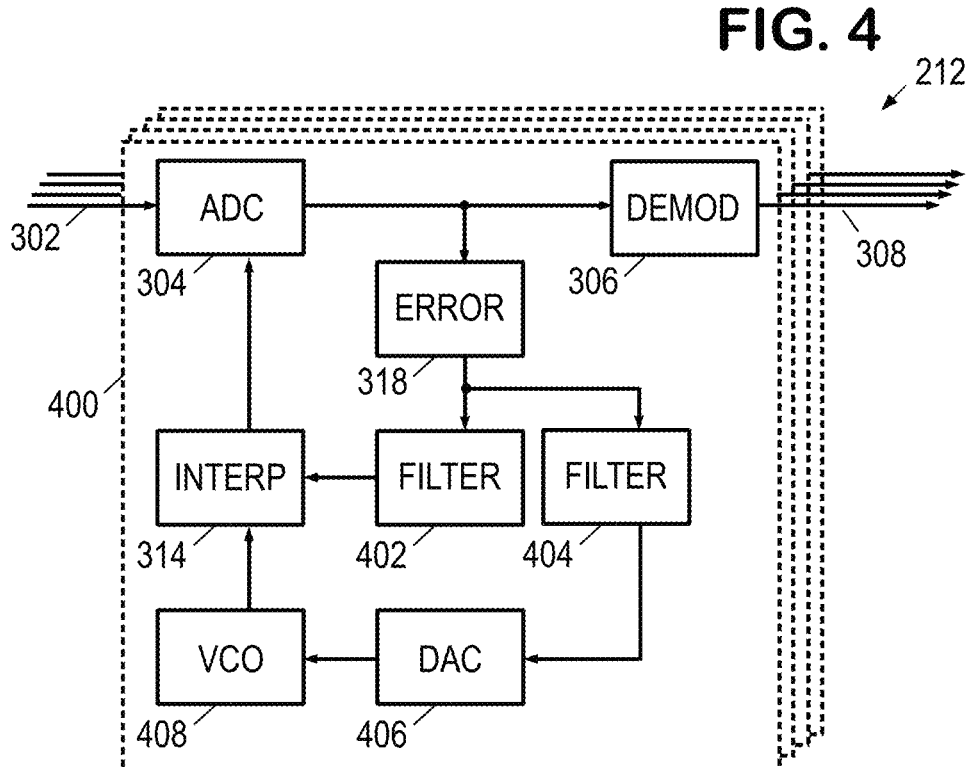
FIG. 4 is a function-block diagram of an integrated multi-channel receiver with independent clock recovery modules.

The presence of the frequency offset and phase errors limits the utility of a high-precision clock signal, let alone multiple such signals locked to a shared oscillator, which is unlikely to have any particular correlation with any of the receive signals. Accordingly, FIG. 4 provides a novel design for an integrated multi-channel receiver 212. The multiple receiver modules 400 retain the analog-to-digital converter 304 for sampling the analog receive signal 302 and providing a digital receive signal to the demodulator 306.

The clock recovery module in FIG. 4 includes, in addition to the phase interpolator 314 and the timing error estimator 318, a phase control filter 402, a frequency control filter 404, a digital to analog converter 406, and a voltage-controlled oscillator (VCO) 408. The error estimator 318 operates on the digital receive signal as before, generating a timing error estimate for each transition of the sampling signal.

However, the integrated multi-channel receiver of FIG. 4 foregoes a joint feedback path for compensating phase error and frequency offset, instead employing separate feedback control paths to correct these effects separately. A phase control filter 402 operates on the timing error estimates to provide the phase interpolator 314 with a phase control signal that minimizes any phase error between the sampling signal and the digital receive signal.

Separately, a frequency control filter 404 operates on the timing error estimates to produce a frequency control signal. A digital-to-analog converter 406 converts the frequency control signal from digital form to an analog frequency control signal having its value represented as a voltage. In some embodiments, the digital to analog converter provides 10-bit resolution. In other embodiments, the digital-to-analog converter is followed by a low-pass analog filter that filters the analog frequency control signal before it is applied to the VCO.

The VCO 408 produces a clock signal having a frequency corresponding to the value of the analog frequency control signal. This clock signal is supplied to the phase interpolator 314. The frequency control filter 404 operates to minimize any frequency offset between the clock signal and the digital receive signal, which indirectly minimizes any frequency offset between the sampling signal and the digital receive signal.

In at least some embodiments, the frequency control filter 404 is a filter with a recursive component. The phase control filter 402 may be a moving average filter or it too may include a recursive component. In at least some contemplated embodiments, the time constant of the frequency control filter is greater than eight times the time constant of the phase control filter.

The design of FIG. 4 is believed to provide robust recovery of the clock information from the digital receive signal and compensation of any sampling signal errors without relying on an extraneous shared oscillator. Design complexity is therefore reduced.

It is acknowledged that multiple oscillators are present on a shared substrate in the integrated multi-channel receiver, and at high frequencies the oscillators may tend to exhibit coupling effects, potentially introducing reduced frequency stability, known as "pulling". However, such coupling effects can be minimized with careful circuit design, e.g., positioning traces with sufficient separation or suitable geometries to minimize or compensate for inductor and capacitive coupling.

Figure 5:
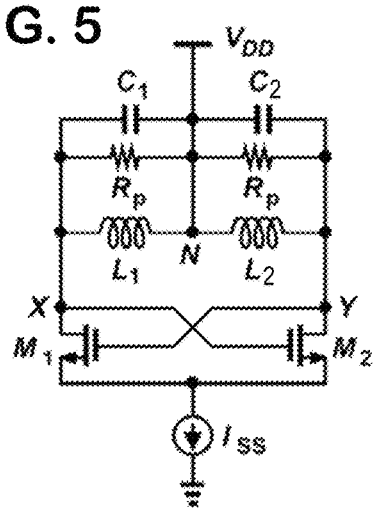
FIG. 5 is a circuit diagram of an illustrative voltage-controlled oscillator.

An illustrative VCO circuit schematic is shown in FIG. 5. When power is first applied, the transistors M1, M2 are both off and the capacitors C1, C2 are quickly charged. Currents begin to flow through inductors L1, L2, raising the voltage at nodes X, Y. One of the nodes, say node Y, charges slightly faster, causing transistor M1 to conduct while transistor M2 is still off. Current source Iss reduces the voltage at node X, momentarily "latching" the transistors in their state. As the node Y voltage continues to increase, capacitor C2 is discharged as the current through inductor L2 falls. The current flowing through inductor L1 and its parallel resistor Rp exceeds Iss, raising the voltage at node X, causing transistor M2 to turn on and enable the current source Iss to drop the voltage at node Y, turning transistor M1 off.

Thereafter, the currents in inductors L1, L2, act to charge capacitors C1, C2, which in turn reverse the currents in the inductors, which in turn reverse the charges on the capacitors, which then complete the resonance cycle by restoring the currents in inductors L1, L2. The transistors M1, M2 enable the current source Iss to "boost" the inductor currents at the right moments to sustain the oscillation. If the voltages from nodes X,Y are supplied to a differential amplifier, a square wave clock signal is produced at the resonance frequency. Capacitors C1, C2 may be voltage-controlled capacitors, enabling the resonance frequency to be controlled by a bias voltage on the capacitors.

The contemplated VCOs on the monolithic semiconductor substrate each include a center-tapped inductor coil as part of a resonant circuit. The primary contributor to coupling between such oscillators is magnetic coupling between the inductors of one oscillator and the inductors of its neighbors. To minimize unwanted inductive coupling effects, alternative loop inductor designs may be used.

Figure 6A:
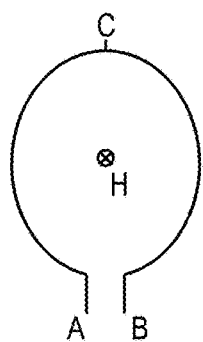
FIGS. 6A-6C show illustrative loop inductor configurations.
Figure 6B:
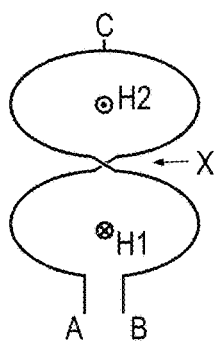
Figure 6C:
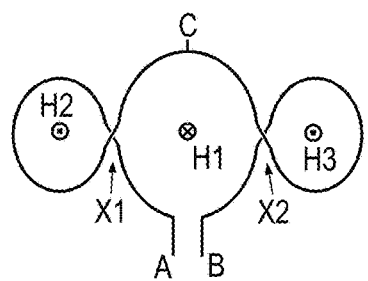

FIGS. 6A-6C present three illustrative loop inductor designs. At the frequency range of interest, the desired induction value can be achieved with a conductive trace on a insulated substrate. FIG. 6A shows a one-loop ("Type-0") design, with the trace between terminals A,B enclosing a single region. Terminals A,B may be coupled to nodes X,Y in the circuit of FIG. 5, while the node N of FIG. 5 is coupled to a center tap at C. The single-loop design forms a single magnetic dipole represented by the magnetic field H. This single dipole is susceptible to near-field coupling and radio frequency interference with other components.

FIG. 6B shows a two-loop ("Type-8") design intended to reduce such coupling and interference. The trace between terminals A,B includes a crossover X, in which vias route one of the edges to another trace layer for a distance sufficient to permit the other edge to cross over without shorting to the first edge. As the electrical characteristics of the vias and each trace layer may be different, the crossover introduces a slight imbalance relative to the center tap C, potentially coupling noise from the power source into the oscillation signal. Nevertheless, the crossover enables the trace to enclose two regions of similar size and shape with currents flowing in an opposite sense, thereby forming opposing magnetic dipoles as represented by the magnetic fields H1, H2. At a distance, these opposing dipoles effectively cancel out, yet at closer spacings a degree of near-field coupling remains. In particular, the circuit designer must guard against any arrangements having unequal spacing between the loops of different inductors. For example, a side-by-side arrangement is to be preferred over an end-to-end arrangement.

FIG. 6C shows a three-loop design which further reduces near field coupling and relaxes the layout restrictions on nearby inductors. In this design, the trace between terminals A,B includes two crossovers X1, X2. As there are two, the electrical characteristic deviations can now be balanced relative to the center tap C. With the two crossovers, the trace encloses a central region and encloses two side regions with a current flow in an opposite sense relative to the center region. The center region forms a magnetic dipole H1, while the side regions form two opposing magnetic dipoles H2, H3. Each of the side regions has about half the area of the central region, so that the opposing dipoles H2, H3 are half the strength of the center dipole and the three dipoles cancel out at a distance.

Figure 7:
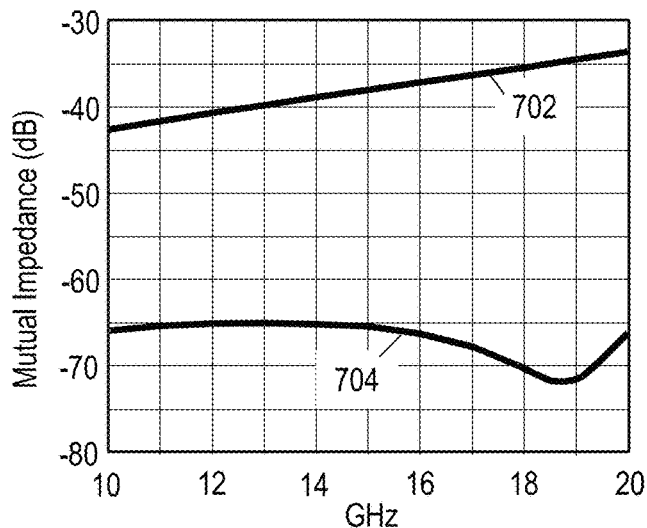
FIG. 7 is a graph comparing the coupling between different inductor configurations.

FIG. 7 is a graph showing, as a function of frequency, the simulated mutual coupling between one-loop inductors spaced 477 um apart (curve 702). Also shown is the simulated coupling between three-loop inductors having the same inductance value and center-to-center spacing (curve 704). When the inductors are spaced apart along their long axis, the three-loop inductor design offers an isolation improvement greater than 23 dB (about 10 dB better than that of the two-loop design).

Figure 8A:
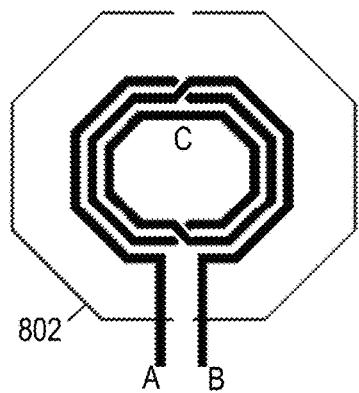
FIGS. 8A-8C show illustrative multi-winding loop inductor configurations.
Figure 8B:
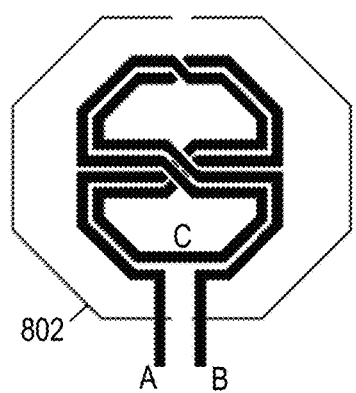
Figure 8C:
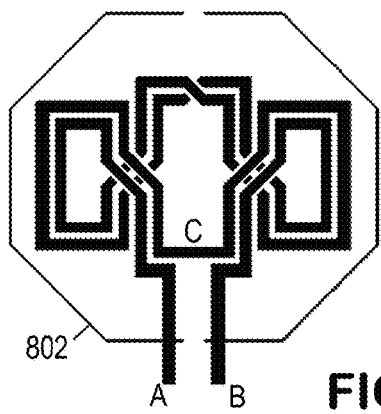

Note that the designs of FIGS. 6A-6C are designs having one winding or "turn", but they nevertheless illustrate principles that are also applicable to multi-turn designs. FIGS. 8A-8C show three multi-turn designs having the same area and shape of guard ring 802 and the same inductance value, each of them employing trace widths in the 4 to 6 micrometer range. FIG. 8a shows a three-turn single-loop inductor, FIG. 8B shows a two-turn two-loop design, and FIG. 8C shows a two-turn three-loop design.

Figure 9:
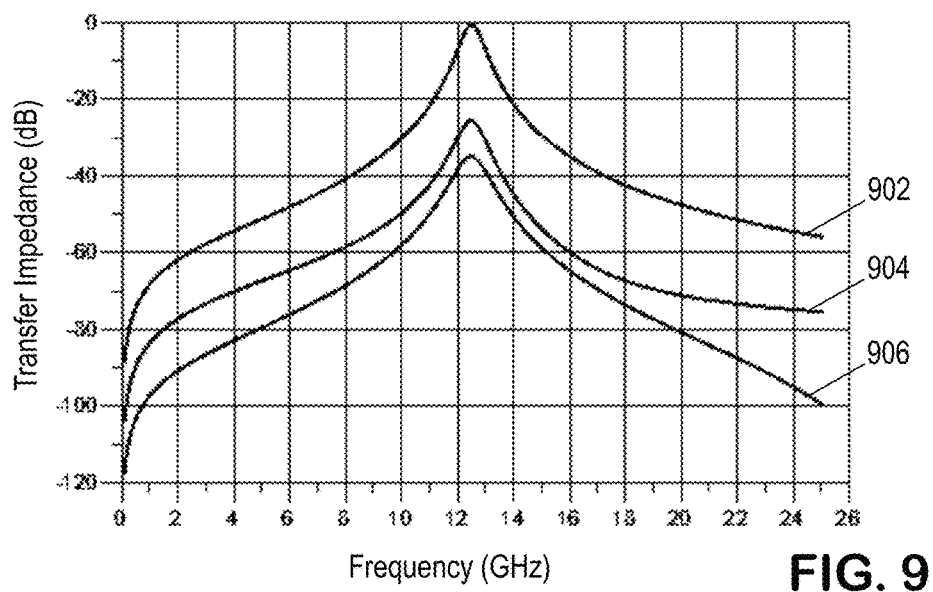
FIG. 9 is a graph comparing coupling between oscillators using the different inductor configurations.

FIG. 9 compares the simulated transfer impedance for each of these designs operating in the circuit of FIG. 5. The simulated circuits are spaced at 477 um. Note that the coupling is amplified near the resonance frequency of the circuits (12.5 GHz). While the two-loop inductor design offers 25 dB in isolation improvement at the resonance frequency, the three-loop design offers a substantial improvement with nearly 35 dB of isolation.

Figure 10A:
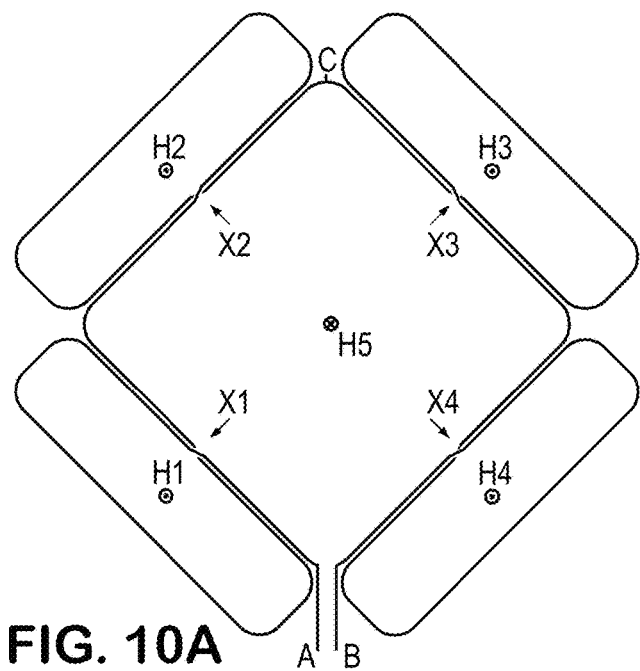
FIGS. 10A-10C show additional illustrative loop inductor configurations.
Figure 10B:
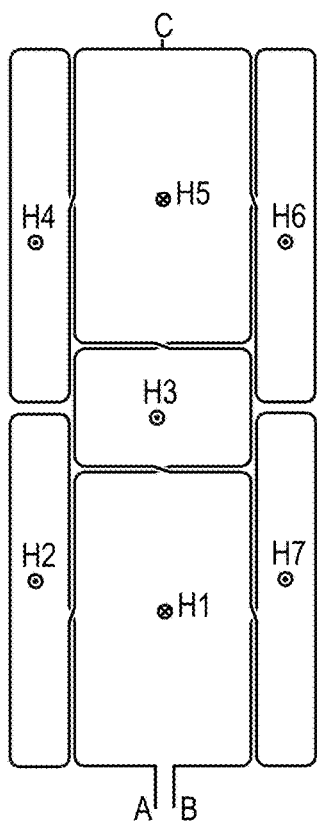
Figure 10C:
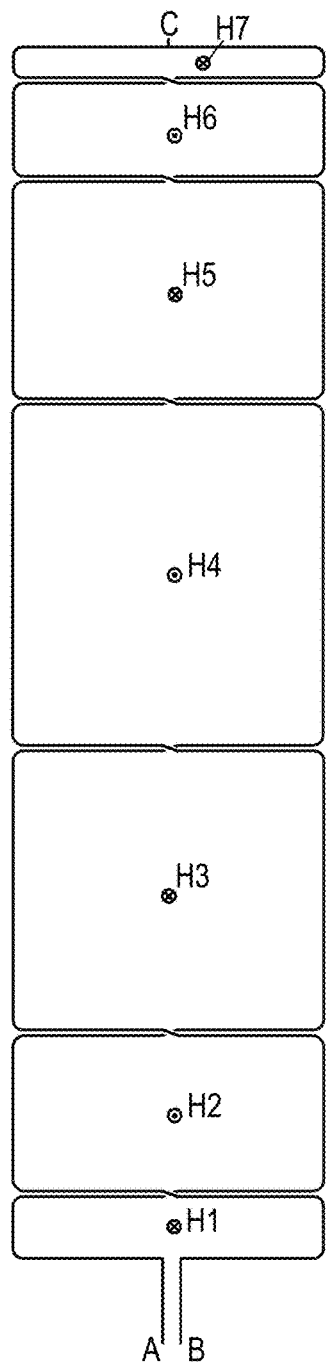

The principles illustrated above can be extended to inductors having larger numbers of loops, such as those shown in FIGS. 10A-10C. FIG. 10A shows a five-loop inductor design having four peripheral loops evenly spaced around a center loop, each having an area one-quarter that of the center loop and oriented in opposition thereto so that the loop dipoles H1, H2, H3, H4, H5 sum to zero. A similar seven-loop design would have six peripheral loops evenly spaced around the center loop, each peripheral loop having one-sixth the area of the center loop. (Of course, the design of FIG. 6C can be considered as a center loop with two evenly spaced peripheral loops.)

Such designs are symmetric about an axis drawn from the center tap to a midpoint between the connection terminals A, B. A second axis of symmetry may be drawn perpendicular to the first axis, except that a rotation about this axis causes the center tap to exchange places with the connection terminals. This degree of symmetry is not a requirement, but is expected to provide more efficient cancellation of near-field coupling effects as well as effective far-field cancellation.

FIG. 10B shows an illustrative seven-loop inductor design having two loop dipoles H1, H5 being countered by four peripheral loop dipoles H2, H4, H6, H7, and a center loop dipole H3. This design reduces the disparity between the strongest and weakest dipoles in the design, using loops with varying perimeters to reduce standing wave effects at higher frequencies.

FIG. 10C shows another illustrative seven-loop inductor design having a linear arrangement of dipoles with alternating polarities. Thus loop dipoles H1, H3, H5 and H5 are collectively canceled by loop dipoles H2, H4, and H6. The perimeters of the illustrative design are relatively prime, further minimizing any standing wave effects on the inductor's frequency response. Additional degrees of freedom are achieved with an increasing number of loops, enabling the design to account for standing wave effects or other design considerations.

The designs shown in FIGS. 10A-10C are single-turn designs, producing N−1 cross-overs where N is the total number of loops. This yields an even number of crossovers when the total number of loops is odd, enabling the design to provide a balance, i.e., to provide the same number of cross-overs and cross-unders along each electrical path from the center tap to one of the connection terminals. Additional complexity arises for multi-turn designs, but a balanced number of cross-overs and cross-unders remains desirable to minimize noise on the center tap.

Numerous alternative forms, equivalents, and modifications will become apparent to those skilled in the art once the above disclosure is fully appreciated. It is intended that the claims be interpreted to embrace all such alternative forms, equivalents, and modifications that are encompassed in the scope of the appended claims.

What is claimed is:

1. An integrated circuit comprising:
   a substrate; and
   an inductor on said substrate, the inductor having multiple non-overlapping loops each defining a corresponding dipole, the multiple dipoles summing to zero, with at least one of said loops having an area unequal to that of at least one other of said loops, the inductor having a total number of loops equal to five.

2. The integrated circuit of claim 1, wherein each of said loops has two or more turns.

3. The integrated circuit of claim 1, wherein the inductor has at least one axis of symmetry.

4. An integrated circuit comprising:
   a substrate; and
   an inductor on said substrate, the inductor having multiple non-overlapping loops each defining a corresponding dipole, the multiple dipoles summing to zero, with at least one of said loops having an area unequal to that of at least one other of said loops,
   wherein but for connection terminals, the inductor has two axes of symmetry.

5. An integrated circuit comprising:
   a substrate; and
   an inductor on said substrate, the inductor having multiple non-overlapping loops each defining a corresponding dipole, the multiple dipoles summing to zero,
   with at least one of said loops having an area unequal to that of at least one other of said loops, and
   with each electrical path from a center tap to a connection terminal including an equal number of cross-overs and cross-unders.

6. An integrated circuit comprising:
   a substrate; and
   an inductor on said substrate, the inductor having multiple non-overlapping loops each defining a corresponding dipole, the multiple dipoles summing to zero, with at least one of said loops having an area unequal to that of at least one other of said loops,
   said multiple non-overlapping loops including a center loop and N peripheral loops equally spaced around a perimeter of the center loop, the center loop having an area N times that of each peripheral loop.

7. The integrated circuit of claim 6, further comprising multiple ones of said inductors.

8. An electrical circuit manufactured on a substrate, the electrical circuit including a plurality of inductors, each inductor comprising multiple non-overlapping loops including:
   a center loop defining a central magnetic dipole; and
   a plurality of peripheral loops equally spaced around a perimeter of the center loop, each peripheral loop defining a peripheral magnetic dipole oriented opposite the central magnetic dipole, the plurality of peripheral loops each having an area unequal to that of the center loop to collectively cancel a field from the central magnetic dipole.

9. The circuit of claim 8, wherein each of the peripheral loops is equally-sized.

10. The circuit of claim 8, wherein the circuit comprises a plurality of independent oscillators, each oscillator including one of said plurality of inductors.

11. The circuit of claim 8, wherein the inductor has a total number of loops, the total number being an odd integer.

12. The circuit of claim 11, wherein each of said peripheral loops has two or more turns.

13. The circuit of claim 8, wherein each inductor has a center tap, and wherein each electrical path from the center tap to a connection terminal includes an equal number of cross-overs and cross-unders.

14. A method for manufacturing an integrated circuit with multiple low-field inductors on a substrate, the method comprising:

providing a center loop that defines a central magnetic dipole; and providing a plurality of equally-sized peripheral loops equally spaced around a perimeter of the center loop, each peripheral loop defining a peripheral magnetic dipole oriented opposite the central magnetic dipole, the plurality of peripheral loops each having an area unequal to that of the center loop to collectively cancel a field from the central magnetic dipole.

15. The method of claim 14, wherein the inductor has a total number of loops, the total number being an odd integer.

16. The method of claim 15, wherein the total number of loops is five.

17. The method of claim 14, wherein the center loop and each of said peripheral loops has two or more turns.

* * * * *